United States Patent
Sakamoto

(10) Patent No.: US 9,703,906 B2
(45) Date of Patent: Jul. 11, 2017

(54) CIRCUIT SIMULATION DEVICE, CIRCUIT SIMULATION METHOD, AND CIRCUIT SIMULATION PROGRAM

(71) Applicant: Renesas Electronics Corporation, Tokyo (JP)

(72) Inventor: Hideo Sakamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/922,467

(22) Filed: Oct. 26, 2015

(65) Prior Publication Data

US 2016/0210386 A1 Jul. 21, 2016

(30) Foreign Application Priority Data

Jan. 15, 2015 (JP) .................................. 2015-005958

(51) Int. Cl.
  G06F 11/22 (2006.01)
  G06F 17/50 (2006.01)

(52) U.S. Cl.
  CPC .............................. *G06F 17/5036* (2013.01)

(58) Field of Classification Search
  CPC ................................................... G06F 7/5036
  USPC ........................................................ 716/136
  See application file for complete search history.

(56) References Cited

U.S. PATENT DOCUMENTS

| 6,166,558 A * | 12/2000 | Jiang | H01L 22/12 257/E21.53 |
|---|---|---|---|
| 6,295,630 B1 * | 9/2001 | Tamegaya | G06F 17/5036 257/E21.53 |
| 8,423,342 B2 | 4/2013 | Naruta | |
| 2005/0240883 A1 * | 10/2005 | Huang | G06F 17/5036 716/115 |
| 2008/0109770 A1 * | 5/2008 | Kim | G06F 17/5068 716/122 |
| 2009/0002012 A1 * | 1/2009 | Doong | G01R 31/2853 324/762.03 |
| 2009/0184316 A1 * | 7/2009 | Hsu | H01L 22/14 257/48 |
| 2010/0082308 A1 * | 4/2010 | Sakamoto | G06F 17/5036 703/2 |

(Continued)

FOREIGN PATENT DOCUMENTS

JP 2011-129615 A 6/2011

*Primary Examiner* — Suresh Memula
(74) *Attorney, Agent, or Firm* — Mattingly & Malur, PC

(57) ABSTRACT

A circuit simulation device includes a measurement unit, a calculation unit, and a processing unit. The measurement unit measures first spaces between adjacent contacts of a plurality of first contacts provided on a source diffusion layer in a line in a direction along which a gate electrode of a transistor extends and also a space between adjacent contacts of a plurality of second contacts provided on a drain diffusion layer in a line in the direction, based on layout design data, and second spaces between the first contacts and the gate electrode and spaces between the second contacts and the gate electrode. The calculation unit calculates a fringe capacitance between the gate electrode, the source diffusion layer, and the drain diffusion layer of the transistor, based on the first and second spaces. The processing unit executes layout simulation based on the fringe capacitance of the transistor.

10 Claims, 6 Drawing Sheets

(56) References Cited

U.S. PATENT DOCUMENTS

| | | | |
|---|---|---|---|
| 2011/0144968 A1* | 6/2011 | Naruta | G06F 17/5036 703/14 |
| 2011/0238393 A1* | 9/2011 | Yoshitomi | G06F 17/5036 703/4 |
| 2013/0024828 A1* | 1/2013 | Lu | G06F 17/5068 716/103 |
| 2013/0117002 A1* | 5/2013 | Goo | G06F 17/5036 703/13 |

* cited by examiner

```
M1 ···. NMOS L=40n W=200n ···
···
```

```
M1 ···. NMOS L=40n W=200n SA=160n SB=160n ···
R1 ···. 0.3
R2 ···. 0.2
C1 ···. 0.2f
C2 ···. 0.3f
···
```

CIRCUIT SIMULATION DEVICE, CIRCUIT SIMULATION METHOD, AND CIRCUIT SIMULATION PROGRAM

CROSS-REFERENCE TO RELATED APPLICATIONS

The disclosure of Japanese Patent Application No. 2015-005958 filed on Jan. 15, 2015 including the specification, drawings and abstract is incorporated herein by reference in its entirety.

The present disclosure relates to a circuit simulation device, a circuit simulation method, and a circuit simulation program, and, more particularly, to a circuit simulation device, a circuit simulation method, and a circuit simulation program, for a semiconductor device including transistors.

BACKGROUND

Circuit simulation for semiconductor devices has increasingly gained importance in recent years.

In this respect, in the semiconductor devices in the related art, the gate capacitance and the wiring capacitance of a MOS-FET transistor have great effect, while the capacitance near the MOS-FET transistor has only negligible effect.

As the miniaturization advances, it causes a problem that measured values of the circuit simulation and the silicon device do not match each other. For example, a simulation error at a frequency more than 10% occurs in a ring oscillator of a digital circuit with 40 nm technology.

The major cause thereof is an error of the simulation accuracy of the capacitance near the MOS-FET transistor.

The characteristics of the capacitance near the MOS-FET transistor are relatively large, and the effect on the circuit frequency becomes large. Particularly, the significant characteristics in circuit design are a gate fringe capacitance, a gate overlap capacitance, and a gate contact plug capacitance, included in the capacitance near the MOS-FET transistor.

At this point, Japanese Unexamined Patent Publication No. 2011-129615 discloses a technique for extracting the gate overlap capacitance as a capacitance of an overlapped part of the gate, the source, and the drain.

A fixed value is generally used for the gate fringe capacitance as one capacitance near the MOS-FET transistor. It does not guarantee circuit simulation with high accuracy.

SUMMARY

The present disclosure has been made to solve the above problem. It is accordingly an object thereof to provide a circuit simulation device, a circuit simulation method, and a circuit simulation program, capable of performing circuit simulation with high accuracy.

Other objects and new features thereof will be apparent from the following description made in connection with the accompanying drawings.

According to an embodiment, a circuit simulation device includes a measurement unit, a calculation unit, and a processing unit. The measurement unit measures, as first spaces, a space between adjacent contacts of a plurality of first contacts provided on a source diffusion layer in a line in a direction along which a gate electrode of a transistor extends and also a space between adjacent contacts of a plurality of second contacts provided on a drain diffusion layer in a line in the direction, based on layout design data. The measurement unit measures, as second spaces, spaces between the first contacts and the gate electrode and spaces between the second contacts and the gate electrode. The calculation unit calculates a fringe capacitance between the gate electrode, the source diffusion layer, and the drain diffusion layer of the transistor, based on the first and second spaces measured by the measurement unit. The processing unit executes layout simulation based on the fringe capacitance of the transistor which is calculated by the calculation unit.

According to an embodiment, a circuit simulation device is possible to execute circuit simulation with high accuracy.

DETAILED DESCRIPTION

Figure 1:
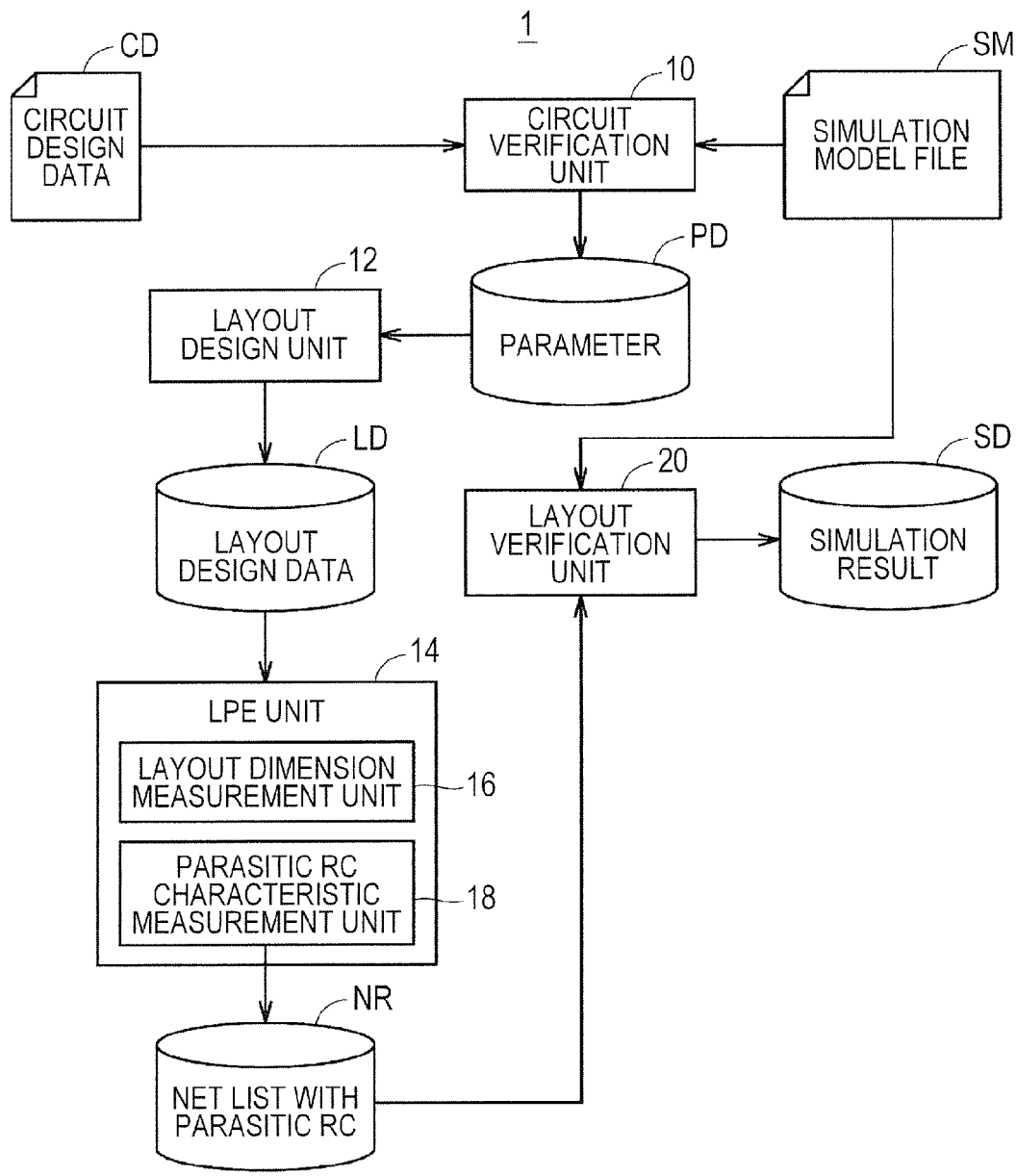
FIG. 1 is a diagram for explaining a circuit simulation device 1 based on an embodiment.

Descriptions will now specifically be made to an embodiment with reference to the accompanying drawings. The same and corresponding elements are identified with the same reference numerals, and thus will not repeatedly be described.

Accordingly, the present disclosure has been made specifically based on the embodiment. The present disclosure is not limited to the embodiment, and various changes may possibly be made thereto without departing from the scope thereof.

FIG. 1 is a diagram for explaining a circuit simulation device 1 based on the embodiment.

As illustrated in FIG. 1, the circuit simulation device 1 is a SPICE (Simulation Program with Integrated Circuit Emphasis) simulation device, and includes a circuit verification unit 10 which executes simulation at the level of circuit based on the inputs of circuit design data and a simulation model file SM. Obtained are various parameters PD of circuit constituent elements (devices) for use in layout design as simulation results of the circuit verification unit 10.

The circuit simulation device 1 includes a layout design unit 12, an LPE (Layout Parasitic Extraction) unit 14, and a layout verification unit 20.

The layout design unit 12 generates layout design data LD in accordance with the corresponding parameter PD.

The LPE unit 14 includes a layout dimension measurement unit 16 and a parasitic RC characteristic calculation unit 18.

The layout dimension measurement unit 16 measures (calculates) various layout dimensions in accordance with the layout design data LD.

The parasitic RC characteristic calculation unit 18 calculates the parasitic resistance (R) and the parasitic capacitance (C) of the MOS-FET transistor (hereinafter simply referred to as a transistor), in accordance with the measured layout dimensions. The unit 18 outputs a net list NR with the parasitic RC in consideration of the parasitic resistance and the parasitic capacitance.

The layout verification unit 20 outputs a simulation result SD, based on the net list NR with the parasitic RC and the simulation model file SM.

Figure 2:
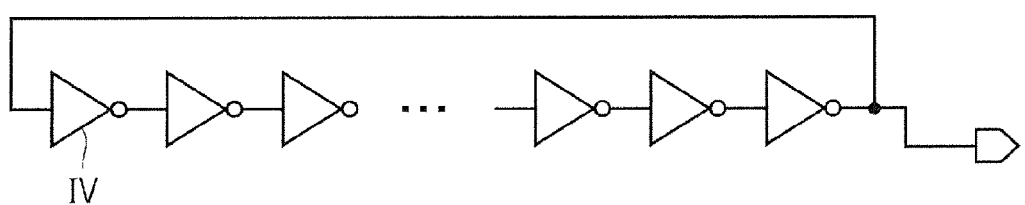
FIG. 2 is a diagram for explaining an example of a ring oscillator circuit based on the embodiment.

FIG. 2 is a diagram for explaining an example of a ring oscillator circuit based on the embodiment.

As illustrated in FIG. 2, a plurality of inverters IV are coupled in series, and are configured to be coupled in a ring-like form. The inverter IV includes a P-channel MOS transistor and an N-channel MOS transistor.

The circuit verification unit 10 executes circuit simulation based on a circuit diagram of the ring oscillator circuit as an example of the circuit design data and the simulation model file. By this circuit simulation, verification is made as to whether the output of the designed ring oscillator circuit has desired characteristics (for example, frequency characteristics). When the desired characteristics are not output, various parameters PD are adjusted again to output the desired characteristics.

The layout design unit 12 designs the layout design data LD in accordance with the parameters PD obtained as the verification result of the ring oscillator circuit, with the desired characteristics by the circuit simulation of the circuit verification unit 10. Specifically, it designs a mask layout pattern for forming the ring oscillator circuit.

Figure 3:
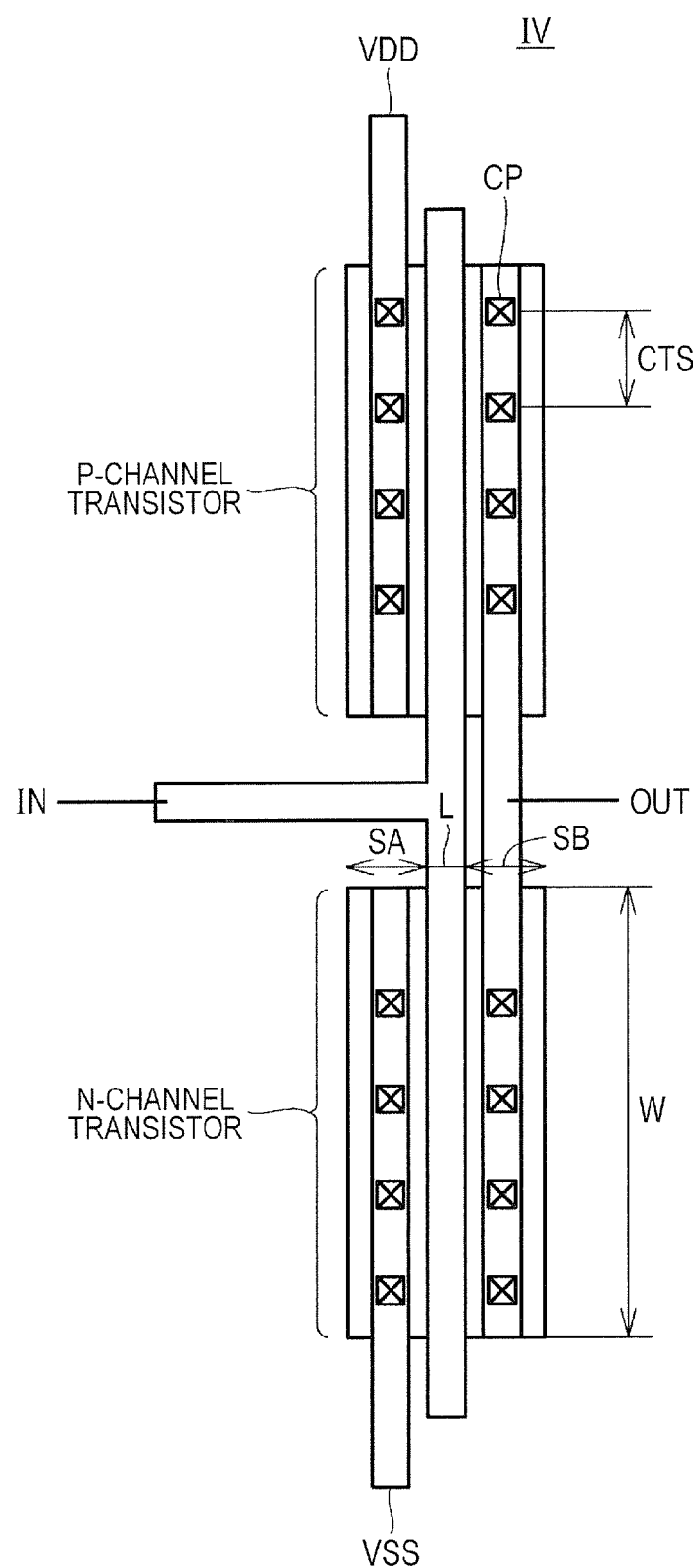
FIG. 3 is a diagram for explaining a layout configuration of an inverter IV based on the embodiment.

FIG. 3 is a diagram for explaining a layout configuration of the inverter IV based on the embodiment.

As illustrated in FIG. 3, the layout configuration is a part of the layout design data LD.

The inverter IV has a P-channel MOS transistor and an N-channel MOS transistor. The source diffusion layer of the P-channel MOS transistor is coupled to a source line VDD, through contact plugs CPs arranged at spaces CTS of contact plugs. The drain diffusion layer is coupled to a signal line OUT for outputting an output signal through the contact plugs CPs arranged at the spaces CTS of contact plugs.

The gate is coupled to a signal line IN for inputting an input signal.

Similarly, the source diffusion layer of the N-channel MOS transistor is coupled to a grounding line VSS through contact plugs CP arranged at the spaces CTS of contact plugs. The drain diffusion layer is coupled to a signal line OUT for outputting an output signal through the contact plugs CP arranged at the spaces CTS of contact plugs.

The layout design unit 12 designs a net list for use in simulation, as layout design data LD.

Figures 4, 5, 6:
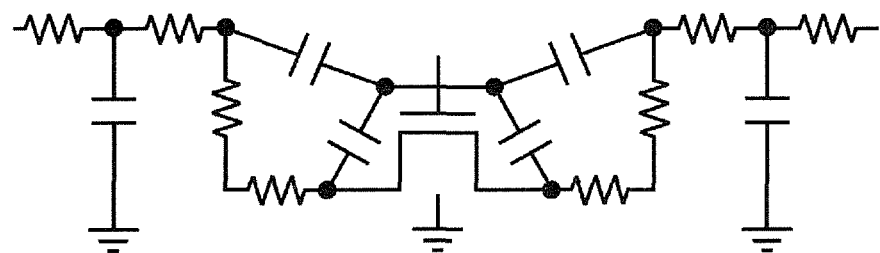
FIG. 4 is a diagram for explaining an example of a net list based on the embodiment.
FIG. 5 is a diagram for explaining the parasitic resistance (R) and the parasitic capacitance (C) of a transistor.
FIG. 6 is a diagram for explaining an example of a net list NR with the parasitic RC.

FIG. 4 is a diagram for explaining an example of a net list based on the embodiment.

FIG. 4 illustrates examples of a gate length L and a gate width W of a metal wiring layer (M1) as one layer for forming the gate of the N-channel MOS transistor of the inverter IV with the layout configuration of FIG. 3. Any other layout configurations are explained similarly in the form of a net list.

The LPE unit 14 calculates the parasitic RC characteristics based on the layout design data LD designed by the layout design unit 12.

FIG. 5 is a diagram for explaining the parasitic resistance (R) and the parasitic capacitance (C) of a transistor.

FIG. 5 illustrates a state in which various parasitic resistance (R) and the parasitic capacitance (C) having an effect on the circuit simulation are added to one transistor.

The layout dimension measurement unit 16 of the LPE unit 14 measures various layout dimensions necessary for calculating the parasitic RC characteristics in accordance with the layout design data LD.

The parasitic RC characteristic calculation unit 18 calculates each of the parasitic resistance (R) and the parasitic capacitance (C) of the transistor in accordance with the measured layout dimensions.

In this embodiment, the fringe capacitance will mainly be described as a parasitic capacitance. It calculates the overlap capacitance and the contact plug capacitance in addition to the fringe capacitance, and obtains the parasitic capacitance.

FIG. 6 is a diagram for explaining an example of a net list NR with the parasitic RC.

FIG. 6 explains information regarding the parasitic RC characteristic of the parasitic resistance (R) and the parasitic capacitance (C) of an N-channel MOS transistor of an inverter IV, in addition to the net list of FIG. 4.

There are explained also information about the layout dimensions measured by the layout dimension measurement unit 16. For example, a length SA of the source diffusion layer and a length SB of the drain diffusion layer of the transistor are explained.

The layout verification unit 20 executes layout simulation based on the net list NR with the parasitic RC and the simulation model file SM. By the layout simulation, verification is made as to whether the output of the designed ring oscillator circuit has desired characteristics (for example, frequency characteristic). When the desired characteristics are not output, the layout design data is adjusted again to output the desired characteristics.

<About Fringe Capacitance>

Figure 7:
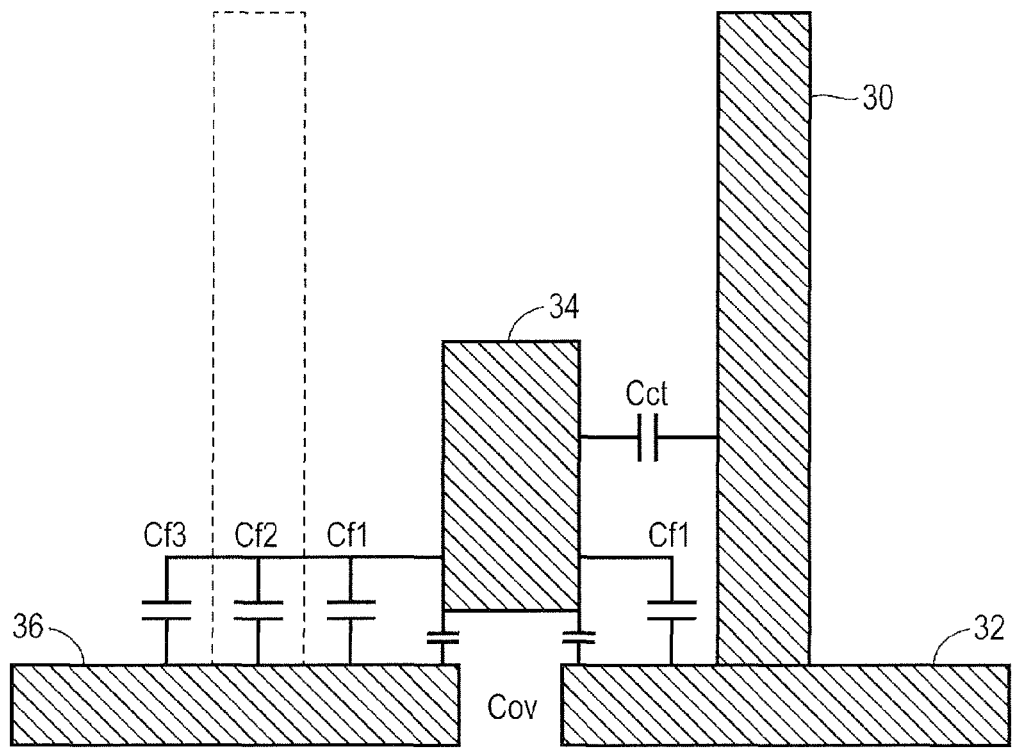
FIG. 7 is a diagram for explaining the fringe capacitance of the transistor based on the embodiment.

FIG. 7 is a diagram for explaining the fringe capacitance of the transistor based on the embodiment.

FIG. 7 illustrates a cross sectional configuration of the transistor.

Specifically, the transistor includes a drain diffusion layer 32, a source diffusion layer 36, a gate 34, and a contact plug 30.

Illustrated are a gate overlap capacitance Cov and a contact plug capacitance Cct. The gate overlap capacitance is a capacitance of an overlapped part of the gate 34, the source diffusion layer 36, and the drain diffusion layer 32. The contact plug capacitance Cct intervenes between the gate 34 and the contact plug 30.

Illustrated is also a fringe capacitance Cf between the gate 34, the source diffusion layer 36, and the drain diffusion layer 32.

Conventionally, a fixed value is set at the fringe capacitance Cf between the gate 34, the source diffusion layer 36, and the drain diffusion layer 32, regardless of the arrangement of the contact plug coupled to the source diffusion layer 36 and the drain diffusion layer 32.

In fact, if the contact plug 30 is arranged, a line of electric force for the source diffusion layer 36 and the drain diffusion layer 32 is partially shielded, and there occurs a physical phenomenon in which the fringe capacitance Cf decreases.

In this embodiment, descriptions will be made thereto, as a fringe capacitance component Cf1 (a first capacitance characteristic parameter) fixed regardless of the arrangement of the contact plug 30 and also fringe capacitance components Cf2 and Cf3 (second capacitance characteristic parameters) with characteristics varying depending on the arrangement of the contact plug.

If the contact plug 30 is arranged, the fringe capacitance component Cf2 varies in accordance with the arrangement, based on a physical principle that the line of electric force is not physically coupled to the source diffusion layer 36 and the drain diffusion layer 32.

If the contact plug 30 is arranged, the fringe capacitance component Cf3 varies in accordance with the arrangement, based on a physical principle that the line of electric force is not physically coupled onto the diffusion layer from the contact plug 30 to the gate direction backward part.

As the miniaturization advances, the dimension between the gate and the contact plug decreases. Thus, the percentages of the fringe capacitance components Cf2 and Cf3 to vary are relatively greater than the fringe capacitance component Cf1.

Thus, there is a considerable divergence between the fringe capacitance for use in the simulation in the related art and the fringe capacitance of the measured value.

The line of electric force is shielded in accordance with the arrangement of the contact plug, and there occurs a physical phenomenon in which the fringe capacitance coupled to the source and drain diffusion layers decreases. Therefore, it is necessary to obtain the fringe capacitance Cfdel (Cf2+Cf3) which varies based on dimensions dc and dpc in accordance with the arrangement of the contact plug.

In this case, the dimension dc is a dimension (a first space) between adjacent contact plugs. If a contact plug is provided at the end, the dimension is between the end of the diffusion layer and this contact plug. The dimension dpc is a dimension (a second space) between the gate and the contact plug.

Figure 8:
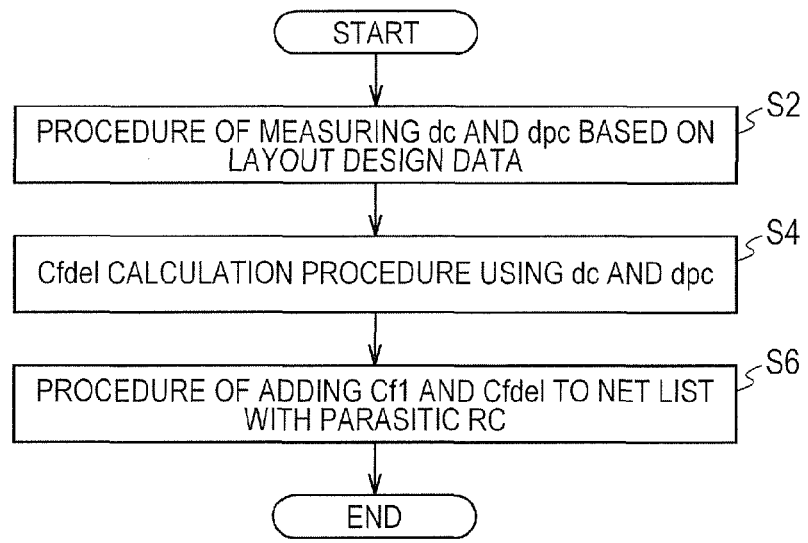
FIG. 8 is a flow diagram for explaining a process of an LPE unit 14.

FIG. 8 is a flow diagram for explaining a process of the LPE unit 14.

As illustrated in FIG. 8, a process for measuring the dimensions dc and dpc based on the layout design data is executed (Step S2).

The fringe capacitance Cfdel is calculated based on the measured dimensions dc and dpc (Step S4).

There is executed a process for adding the fixed fringe capacitance Cf1 and the fringe capacitance Cfdel to vary into the net list with the parasitic RC (Step S6).

Then, the process ends (END).

Figure 9:
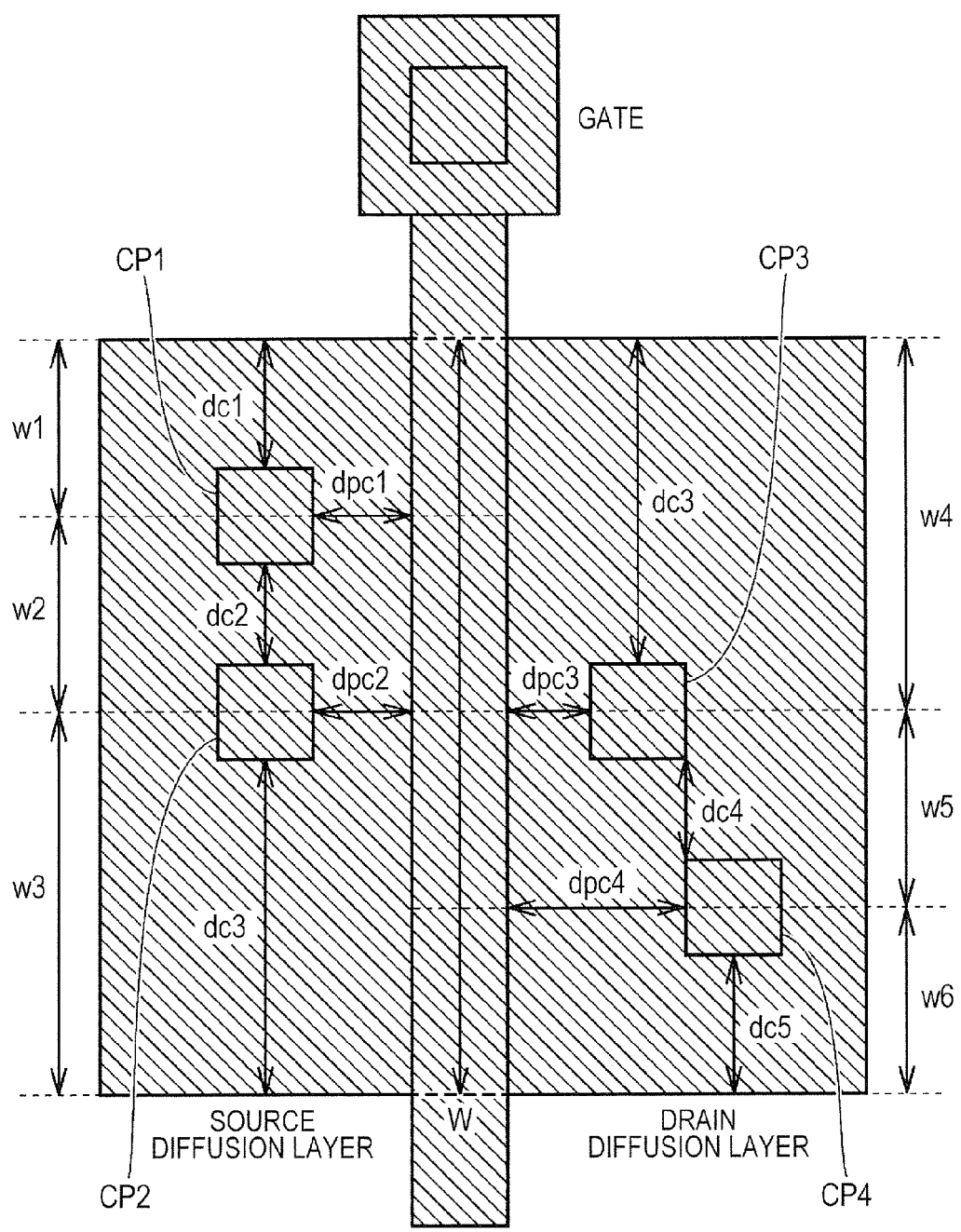
FIG. 9 is a diagram for explaining dimensions dc and dpc to be measured by a layout dimension measurement unit 16 in accordance with the arrangement of the contact plugs based on layout design data.

FIG. 9 is a diagram for explaining that the layout dimension measurement unit 16 measures the dimensions dc and dpc in accordance with the arrangement of the contact plug based on the layout design data.

As illustrated in FIG. 9, the source diffusion layer has two contact plugs CP1 and CP2 arranged thereon in a line in a direction along which the gate electrode extends. The drain diffusion layer includes two contact plugs CP3 and CP4 arranged in a line in a direction along which the gate electrode extends.

The dimension dpc between a contact plug CP1 and the gate is measured (calculated) as dpc1.

The dimension dc between the contact plug CP1 and the end of the diffusion layer is measured (calculated) as dc1.

The dimension dpc between a contact plug CP2 and the gate is measured (calculated) as dpc2.

The dimension dc between the contact plugs CP1 and CP2 is measured (calculated) as dc2.

The dimension dc between the contact plug CP2 and the end of the diffusion layer is measured (calculated) as dc3.

The dimension dpc between a contact plug CP3 and the gate is measured (calculated) as dpc3.

The dimension dc between the contact plug CP3 and the end of the diffusion layer is measured (calculated) as dc3.

The dimension dpc between a contact plug CP4 and the gate is measured (calculated) as dpc4.

The dimension dc between the contact plugs CP3 and CP4 is measured (calculated) as dc4.

The dimension dc between the contact plug 4 and the end of the diffusion layer is measured (calculated) as dc 5.

Figure 10:
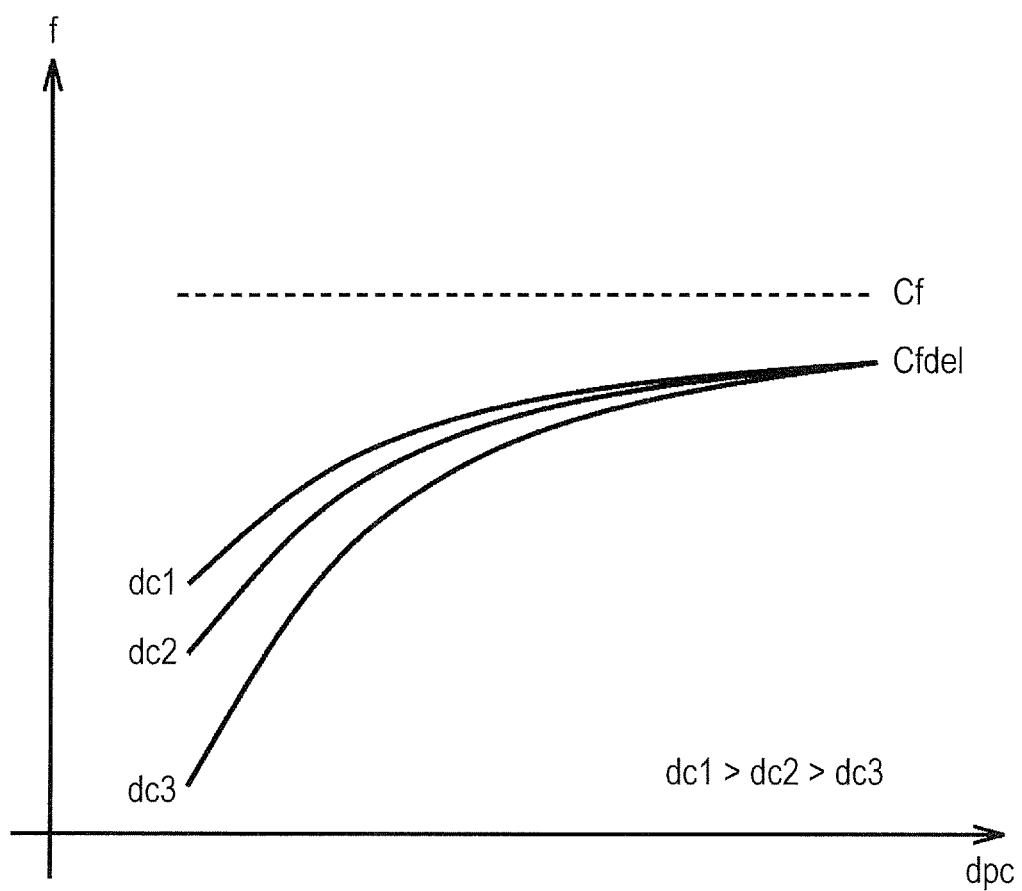
FIG. 10 is a table for calculating the fringe capacitance Cfdel based on the embodiment.

FIG. 10 is a table for calculating the fringe capacitance Cfdel based on the embodiment.

FIG. 10 illustrates characteristic lines of the fringe capacitance Cfdel which oaring in accordance with the dimensions dc and dpc. This table explains the characteristic lines which can be obtained through some experiment based on the dimensions measured in advance.

This table may be kept by the LPE unit 14, or may be acquired from a non-illustrative memory unit.

The parasitic RC characteristic calculation unit 18 calculates the fringe capacitance using the corresponding table based on the dimension measured by the layout dimension measurement unit 16.

Provided are the characteristic lines of the fringe capacitance corresponding respectively to the dimensions dc1, dc2, dc3 (dc>dc2>dc3), by way of example. In this case, the characteristic lines of a cfdel function involving the dimensions dpc and dc as parameters are illustrated.

This fringe capacitance is a fringe capacitance per unit length.

Thus, the fringe capacitance Cfdel on the side of the source can be calculated by "cfdel (dpc1, dc1)*w1+(cfdel (dpc2, dc2)*w2/2+cfel (dpc2, dc2)*w2/2+cfel (dpc2, dc3)*w3".

Similarly, the fringe capacitance Cfdel on the side of the drain can be calculated by "cfdel (dpc3, dc3)*w4+cfdel (dpc3, dc4)*w5/2+cfdel (dpc4, dc4)*w5/2+cfdel (dpc4, dc5)*w6".

It is possible to calculate the fringe capacitance Cf based on the corresponding fringe capacitance Cfdel and the fixed fringe capacitance Cf1.

This information is added to the net list with the parasitic RC, and the layout verification unit 20 executes the layout simulation, thereby enabling to perform simulation with high accuracy.

As a program according to this embodiment, the process explained in FIG. 8 may be provided in the form of the application which can be executed by personal computers. At this time, the program according to this embodiment may be embedded as a part of functions of various applications executed on the personal computers.

What is claimed is:

1. A circuit simulation device comprising:
a processor; and
a memory storing instructions that, when executed by the processor, cause the processor to:
measure, as a plurality of first spaces, a respective spaces between adjacent contacts of a plurality of first contacts provided on a source diffusion layer in a line in a direction along which a gate electrode of a transistor extends and also respective spaces between adjacent contacts of a plurality of second contacts provided on a drain diffusion layer in a line in the direction, and measures, as a plurality of second spaces, respective spaces between the first contacts and the gate electrode and respective spaces between the second contacts and the gate electrode based on layout design data;

calculate a fringe capacitance between the gate electrode, the source diffusion layer, and the drain diffusion layer of the transistor, based on the first and second spaces measured by the measurement unit, and execute layout simulation of the transistor according to the fringe capacitance of the transistor which is calculated by the calculation unit and the layout design data.

2. The circuit simulation device according to claim 1, wherein the fringe capacitance is calculated based on the first and second spaces measured by the measurement unit, in accordance with a calculation table stored in the memory in advance using the first and second spaces.

3. The circuit simulation device according to claim 2, wherein the calculation table has a plurality of tables with fringe capacitances having different characteristics based on the second spaces, in association with each of the first spaces.

4. The circuit simulation device according to claim 1, wherein the layout design data is mask layout design data.

5. The circuit simulation device according to claim 1, wherein the layout simulation is executed using SPICE (Simulation Program with Integrated Circuit Emphasis).

6. The circuit simulation device according to claim 5, wherein the layout simulation uses net list information including information regarding a parasitic resistance and a parasitic capacitance, and wherein the fringe capacitance of the transistor is included in the information regarding the parasitic capacitance.

7. The circuit simulation device according to claim 6, wherein the information regarding the parasitic capacitance further includes an overlap capacitance and a contact plug capacitance.

8. The circuit simulation device according to claim 1, wherein the fringe capacitance includes a first capacitance characteristic parameter which does not depend on an arrangement of the first and second contacts and a second capacitance characteristic parameter which depends on the arrangement of the first and second contacts.

9. A circuit simulation method comprising the steps of:
measuring, as a plurality of first spaces, respective spaces between adjacent contacts of a plurality of first contacts provided on a source diffusion layer in a line in a direction along which a gate electrode of a transistor extends and also respective spaces between adjacent contacts of a plurality of second contacts provided on a drain diffusion layer in a line in the direction, and measuring, as a plurality of second spaces, respective spaces between the first contacts and the gate electrode and respective spaces between the second contacts and the gate electrode based on layout design data;

calculating a fringe capacitance between the gate electrode, the source diffusion layer, and the drain diffusion layer of the transistor, based on the measured first and second spaces, and executing layout simulation of the transistor according to the calculated fringe capacitance of the transistor and the layout design data.

10. A non-transitory, computer readable medium storing a circuit simulation program to be executed on a computer, the circuit simulation program controlling the computer to execute a process including the steps of:

measuring, as a plurality of first spaces, respective spaces between adjacent contacts of a plurality of first contacts provided on a source diffusion layer in a line in a direction along which a gate electrode of a transistor extends and also a respective spaces between adjacent contacts of a plurality of second contacts provided on a drain diffusion layer in a line in the direction, and measuring, as a plurality of second spaces, respective spaces between the first contacts and the gate electrode and respective spaces between the second contacts and the gate electrode based on layout design data;

calculating a fringe capacitance between the gate electrode, the source diffusion layer, and the drain diffusion layer of the transistor, based on the measured first and second spaces; and executing layout simulation of the transistor according to the calculated fringe capacitance of the transistor and the layout design data.

* * * * *